United States Patent
Whitacre et al.

(10) Patent No.: US 11,221,366 B2
(45) Date of Patent: Jan. 11, 2022

(54) SYSTEM AND METHOD FOR MANAGEMENT OF ELECTROCHEMICAL ENERGY STORAGE DEVICES

(71) Applicant: CARNEGIE MELLON UNIVERSITY, Pittsburgh, PA (US)

(72) Inventors: Jay Whitacre, Pittsburgh, PA (US); Guannan He, Pittsburgh, PA (US)

(73) Assignee: Carnegie Mellon University, Pittsburgh, PA (US)

(*) Notice: Subject to any disclaimer, the term of this patent is extended or adjusted under 35 U.S.C. 154(b) by 60 days.

(21) Appl. No.: 16/638,409

(22) PCT Filed: Aug. 13, 2018

(86) PCT No.: PCT/US2018/046537
§ 371 (c)(1),
(2) Date: Feb. 11, 2020

(87) PCT Pub. No.: WO2019/033113
PCT Pub. Date: Feb. 14, 2019

(65) Prior Publication Data
US 2020/0166578 A1 May 28, 2020

Related U.S. Application Data

(60) Provisional application No. 62/605,396, filed on Aug. 11, 2017.

(51) Int. Cl.
*G01R 31/36* (2020.01)
*G01R 31/392* (2019.01)
(Continued)

(52) U.S. Cl.
CPC ....... *G01R 31/3648* (2013.01); *G01R 31/367* (2019.01); *G01R 31/392* (2019.01); *G06Q 10/04* (2013.01); *G06Q 50/06* (2013.01)

(58) Field of Classification Search
CPC .......................... G01R 31/3648; G01R 31/392
(Continued)

(56) References Cited

U.S. PATENT DOCUMENTS

2015/0025696 A1   1/2015   Hug et al.
2015/0277410 A1   10/2015  Gupta et al.
(Continued)

OTHER PUBLICATIONS

International Search Report and Written Opinion for International application No. PCT/US2018/046537, dated Oct. 24, 2018, 7 pages.

*Primary Examiner* — Ricky Go
(74) *Attorney, Agent, or Firm* — Kacvinsky Daisak Bluni PLLC

(57) ABSTRACT

Methods and software for electrochemical energy storage management including operation, planning, and valuation. The decision objective for operation is to maximize the total/remaining life-cycle benefit of electrochemical energy storage, subject to degradation and other operational constraints. The operational decisions are both short term and long term, to address the intertemporal trade-offs brought by degradation issues. Two metrics are proposed for operational and planning decisions respectively: marginal benefit of usage and average benefit of usage. A sample algorithm is provided to solve the multi-timescale optimization problem.

20 Claims, 7 Drawing Sheets

(51) Int. Cl.
*G01R 31/367* (2019.01)
*G06Q 10/04* (2012.01)
*G06Q 50/06* (2012.01)

(58) Field of Classification Search
USPC .......................................................... 702/63
See application file for complete search history.

(56) References Cited

U.S. PATENT DOCUMENTS

| | | | |
|---|---|---|---|
| 2015/0278968 A1* | 10/2015 | Steven | G06Q 10/06314 705/7.35 |
| 2016/0042369 A1* | 2/2016 | Asghari | G06Q 30/0202 705/7.31 |
| 2016/0109895 A1 | 4/2016 | Schindler | |
| 2017/0104332 A1* | 4/2017 | Wenzel | H02J 3/38 |
| 2019/0139159 A1* | 5/2019 | Sarker | G06Q 30/08 |

* cited by examiner

SYSTEM AND METHOD FOR MANAGEMENT OF ELECTROCHEMICAL ENERGY STORAGE DEVICES

RELATED APPLICATIONS

This application is a national phase filing under 35 U.S.C. § 371 claiming the benefit of and priority to International Patent Application No. PCT/US2018/046537, filed on Aug. 13, 2018, which claims the benefit of U.S. Provisional Patent Application Ser. No. 62/605,396, filed Aug. 11, 2017. The entire contents of these applications are incorporated herein by reference.

GOVERNMENT RIGHTS

This invention was made with government support under DE-EE0007165 awarded by Department of Energy. The government has certain rights in the invention.

FIELD OF THE INVENTION

This invention generally relates to the field of electrochemical energy storage management. In particular, the current invention is directed to an intertemporal method and corresponding system for the efficient operation of electrochemical energy storage.

BACKGROUND OF THE INVENTION

Energy storage will play a critical role in providing flexibility in power systems having high levels of integrated renewable energy sources. Unlike other generating resources that have long and reliable useful lifetimes, electrochemical energy storage (EES) suffers from a range of degradation issues that vary as a function of EES type and use. Although several studies have explored ways to account for the degradation cost in investment and operational decisions for various applications (for example, electric vehicle charging/vehicle to grid, microgrid management, energy arbitrage/peak shaving, frequency regulation, multi-service, etc.) a comprehensive and rigorous approach that optimally valuates and manages EES degradation over different decision horizons is still unknown. Developing an approach for managing degradation issues is imperative to mitigate the risk of making operational decisions that greatly deviate from the optimal case in terms of profit maximization based on inappropriate consideration for EES degradation. Additionally, the economic valuation of EES could be highly inaccurate if the profitability of EES is under-estimated, given suboptimal operational decisions.

To take advantage of short-term forecasting information with reduced uncertainty, energy storage systems need to make short-term scheduling decisions much like those for traditional generators. Day-ahead hourly bids may be offered to decentralized electricity markets or some short-term scheduling in coordination with other resources that may be applied in the case of a microgrid. Such a framework works well for traditional generators, as they have explicit short-term operating costs that are independent from past and future scheduling decisions. However, the marginal operating costs of EES systems are near zero, and, more importantly, the unavoidable degradation caused by their usage brings several intertemporal requirements for their operation.

First, EES owners/operators need to determine short-term usage rates according to different short-term benefit opportunities to maximize the benefit per unit of degradation in the long term (life cycle). For example, a deeper cycle can be scheduled when the daily peak-valley price difference is larger, and operation may be interrupted when the price difference is too small. Second, EES a trade-off is required between short-term benefits and the value of lost battery life such that the total life-cycle benefit can be maximized, as larger short-term benefits imply higher EES usage rates and, in turn, shorter EES functional lifetimes. These trade-offs imply that when the benefit opportunity is comparatively low, the EES operators should limit or hold their operation to minimize degradation and wait for a better opportunity. However, because of the calendar degradation associated with most common types of EES (in particular, lithium ion EESs), the EES should not always keep waiting for the best short-term profit opportunity.

Although several studies have explored ways, to account for the cost of the degradation in operational decisions, for example, using levelized cost of degradation (LCOD) methods, there is still a need for a comprehensive and rigorous approach that optimally valuates and manages EES degradation over different decision horizons.

The LCOD method is the most commonly used method to monetize the EES degradation cost in short-term scheduling. It assumes an amortized proportion of initial capital cost to be the degradation cost, while any degradation in the short term will incur a degradation cost proportional to the amount of degradation. One drawback of the existing LCOD methods are that using the average capital cost per unit usage to determine the short-term marginal cost is counterintuitive, and, further, is likely to deviate from the optimal decision in terms of maximizing benefits. In other capital-intensive energy technologies, it is commonly acknowledged that the capital cost or replacement cost per unit production, as a long-term average cost, should have no place in the short-term operational decision making. Another drawback of existing LCOD methods is that decisions based on any "sunk" cost, which has been incurred and cannot be recovered, must be suboptimal. The LCOD derived from the initial capital cost is not only an average cost but also is tied to "sunk" cost, and so should not affect operational decisions. Even if potential replacement costs are considered, the real value of unit energy throughput of an EES may vary over time, independent of the initial capital cost. In fact, the cost of large-scale EESs has been declining dramatically, so much so that future replacement costs could be much lower than the initial capital cost. Lastly, it is difficult to reflect the time preference of EES owners on benefit in different scheduling periods using the time-invariant marginal cost LCOD. For example, if the total available system energy throughput during the useful lifetime of the EES is fixed, it would be preferable to utilize the EES sooner than later. With a marginal operational cost invariant over the EES life, however, the operational decision criteria—characterized by setting the marginal revenues equal to the marginal operational cost to maximize benefit—do not change over time. Hence, there is no time preference in EES utilization.

SUMMARY OF THE INVENTION

Based on classic intertemporal choice theory in microeconomics, an intertemporal decision framework is presented, which, first, coordinates short-term, mid-term and long-term EES scheduling to optimize the life-cycle benefit considering EES degradation, and, second, uses the estimated operational revenue to facilitate investment and subsidy decisions at the planning stage. For simplicity, it is assumed that the EES earns benefits from electricity markets and is a price taker, which implies that the actions of the EES have little impact on the market prices. The benefits of EES can also include generation-cost saving, social welfare, risk premium and so on, and also the bidding strategy of EES can affect market prices when implementing the proposed framework.

Various embodiments of the invention are disclosed which relate to operational and control systems and methods that manages EES intertemporally through short to long terms with a new metric, the marginal benefit of usage (MBU), expressed as $/MWh, to maximize the life-cycle efficiency of EES, given cycling and calendar degradation constraints for various EES chemistries and applications. In one embodiment, the method comprises short-term (typically daily) decisions that determine short-term charge/discharge schedules of EES given the discounted MBU (DMBU) updated in mid-term and forecasted market prices/benefit rates; mid-term (typically annual) updating that calculate discounted MBUs for short-term scheduling by multiplying the life-cycle MBU with a discount factor; and long-term decision that determines the optimal life-cycle MBU to maximize the life-cycle value/profit of EES.

Another embodiment of the invention relates to a system and method for the valuation for any EES chemistries and applications by calculating the maximum efficiency over the remaining life cycle implementing the intertemporal operational method and MBU.

Another embodiment relates to a system and method for the assessment and planning for any EES chemistries and applications by defining a new metric, the average benefit of usage (ABU), and comparing the ABU with the average cost per unit usage/degradation.

These and other aspects and features of non-limiting embodiments of the present invention will become apparent to those skilled in the art upon review of the following description of specific non-limiting embodiments of the invention in conjunction with the accompanying drawings.

BRIEF DESCRIPTION OF THE DRAWINGS

To illustrate the invention, the drawings show aspects of one or more embodiments of the invention. However, it should be understood that the present invention is not limited to the precise arrangements and instrumentalities shown in the drawings.

DETAILED VISION OF THE INVENTION

Figure 1A:
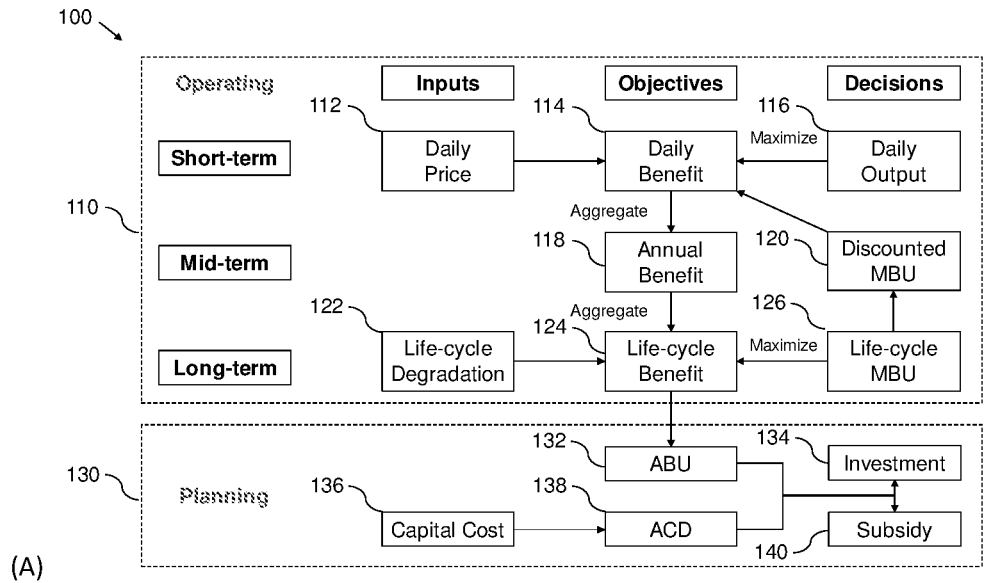
FIG. 1A is a schematic flow chart of the intertemporal decision framework for EES.

FIG. 1A shows an intertemporal decision framework 100 for an energy management system (EMS) consisting of an operational and valuation method 110 that coordinates short-term, mid-term, and long-term EES scheduling to optimize the life-cycle benefit considering EES degradation and a planning method 130 that uses the estimated operational revenue to facilitate investment, replacement, and subsidy decisions. For illustrative simplicity, it can be assumed that the EMS benefits come from electricity markets and that the EMS is a price-taker, which implies that the actions of the EMS in the markets has little or no impact on energy market prices. For various embodiments, the benefits of EMS can come from sources other than maximizing benefit, such as generation cost saving, social welfare, etc., and the bidding strategy of EMS can also affect market prices.

In the short term, typically in a day-ahead situation, the EMS determines the optimal daily outputs and a bid 116 may be placed accordingly in the markets to maximize the daily benefits 114 of the EES based on the discounted MBU (DMBU) 120 determined in the mid-term as well as forecasted day-ahead hourly market prices 112. In certain embodiments, a human operator may implement the bids, based on the output of the EMS. In other embodiments, the EMS may have components capable of automatically placing the bids, independent of a human operator. The DMBU 120 determines the marginal benefit per unit degradation for the optimal EES scheduling strategy, playing the role of short-term marginal cost, but is independent of the capital or replacement cost.

The offer or bid usually consists of the price and amount of energy to buy or sell. After collecting all bids and offers from the agents, a market operator or system operator clears the market based on some rules and the physical constraints of the power system. The bid-offer and clearing processes typically take place both in the day-ahead horizon (day-ahead markets) and real-time horizon (real-time markets). In the day-ahead markets, the amounts and settled prices of the energy to be delivered or consumed by the agents over the next day are determined.

The market clearing process is to match electricity supply with demand at a reasonable price subject to physical transmission constraints and system stability constraints. The market operator, usually named independent system operator (ISO) or regional transmission organization (RTO), regulates and monitors the clearing process. Each agent, such as generators, storage, etc. submits offers/bids that include the amount of electricity to be sold into or bought from the market and a specific price or offer/bid curves to sell/buy different amounts of electricity at different prices. Once the offering/bidding window is closed, the market operator sorts the received offers and selects a lowest clearing price, which is usually named the marginal price. The agents that submit offers with prices lower than or bids with prices higher than the marginal prices will be dispatched during the corresponding time periods. In the real-time operation, the agents are required to provide or consume the amounts of electricity committed in the offers/bids they win, or they have to compensate the gaps by offering/bidding in other markets with probably less appealing prices.

For the mid-term, typically a time frame between a month and a year, the EES operator calculates the DMBU 120 as the product of a discounting factor and the life-cycle MBU 126, which is determined in the long-term. The annual benefit 118 is the sum of the daily benefits 114. The discounted MBU 120 takes the time values of the short-term EES into consideration and feeds into the short-term scheduling as input parameter.

For the long-term, the EES operator determines the optimal life-cycle MBU 126 to maximize the life-cycle benefit 124, which is the sum of the discounted short-/mid-term benefits 114/118 in each year, subject to EES degradation constraints 122 over the EES life. The life-cycle MBU 126 feeds into the mid-term to compute the discounted MBU 120.

For the planning stage, the ABU 132 and the average cost of degradation (ACD) 138 are calculated by dividing the life-cycle benefit and the initial capital cost by the life-cycle energy throughput, respectively. Investment decisions and subsidy policies can be informed by comparing the ABU 132 with the ACD 138. As such, the methods can be applied in economic assessment and planning software of EES in some embodiments.

At the simulation/evaluation stage, all prices and benefits are forecasted. In short-term simulation, a life-cycle MBU may be calculated for all different daily benefits with all life-cycle MBUs (MBU is intrinsically continuous, but it can be approximated by discretization to make the possible number finite). In the short-term operation, the optimal life-cycle MBU determined in the simulation to calculate the discounted MBU and then make day-ahead bidding and operating decisions is used.

A system implementing the EES management system (EMS) described herein may interface with a battery management system (BMS) connected to the EES and may draw data from the BMS and control the scheduling of the charge/discharge cycles of the EES. Any type of bi-directional data connection may be established between the EMS and the BMS, including wired or wireless connections of any type. The BMS collects battery data such as charging/discharging status, power, voltage, current, temperature, state of charge (%, which indicates the charge level of the battery), state of health (the remaining capacity as % of the original capacity), etc. There are advanced BMSs that may provide more complicated information. EMS can get data from the BMS, make operational decisions, and control the charge/discharge schedule of the battery through an inverter or other controller.

In the context of the EMS, the planning, long-term and short-term decisions should be made sequentially. Investors should first decide whether to invest on and construct an EES system based on a cost/benefit analysis. After the EES is constructed, the operational decisions are required. The EES operator should first determine the long-term optimal life-cycle MBU, and then update the DMBU. Last, the EES outputs for each short-term scheduling periods should be determined.

Figure 1B:
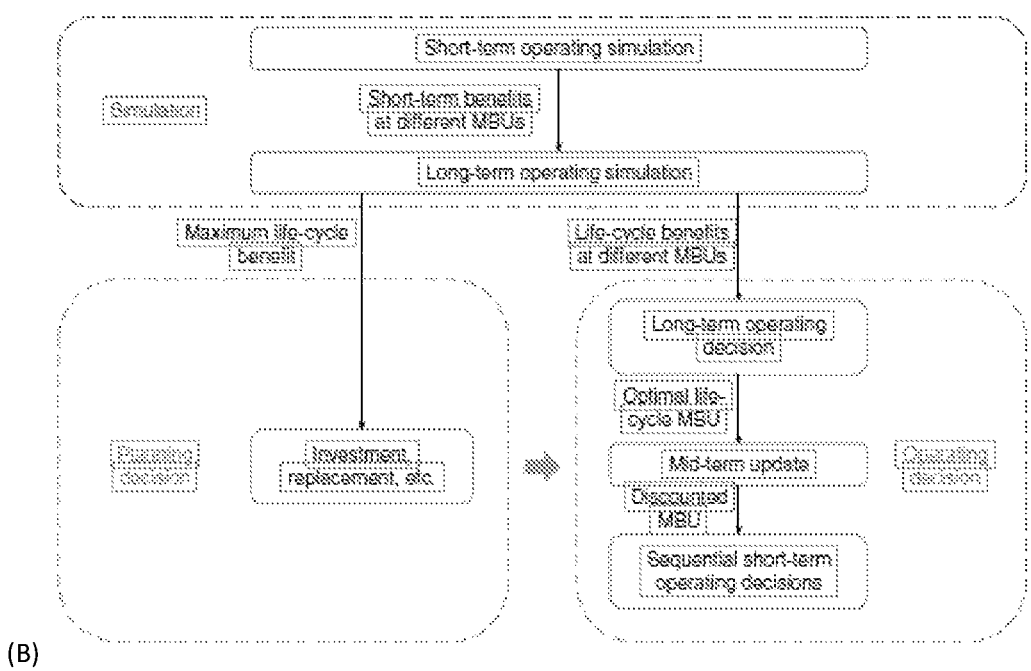
FIG. 1B is a schematic flow chart showing the simulation process.

The preceding decisions require the simulations of later decisions. Therefore, the simulation order is inverse to the decision order. To make a long-term decision (determining the life-cycle MBU), the EES operator should simulate short-term operation for all the values of MBU in a reasonable set based on future price projections and aggregate the maximum short and mid-term benefits of each period to compute the life-cycle benefit, as shown in FIG. 1B. These short/mid-term benefits do not have to be equal to the actual benefits earned in each period-they are just simulated values that reflect the expected future benefit opportunities to facilitate long-term decisions. After the optimal life-cycle MBU and corresponding maximum life-cycle benefit are determined, the ABU can be calculated, and the planning decision can be made.

The major assumption in this framework is that EES degradation is a Markov process throughout its lifetime. That is, the degradation incurred during a certain period only depends on the state of EES at the beginning of the period and the operational decisions made in this period, which implies the degradations can be linearly aggregated over different periods to compute the total degradation. This assumption is generally valid in electrochemistry and is also adopted in other methods used to consider EES degradation, for example, the LCOD method.

The required information in the framework includes the short-term price forecasts over the EES life. At present, perfect price forecasts are impossible in any markets, and imperfect forecasts inevitably cause errors on the revenue estimation results. The forecasting error, however, only affects the method of the present invention by the mean forecasting error. This can, in turn, be relatively small, depending on the forecasting tool used. The projected life-cycle revenue and corresponding MBU will change as the expectations on the future electricity market prices change, similar to the fluctuations of stock market values. The EMS framework presented herein aims to produce the optimal decisions in terms of the maximization of life-cycle benefit under both degradation estimation and price forecasting uncertainties.

In the EMS framework shown in FIG. 1, the required information includes the hourly price forecasts over the EES life. To precisely predict the hourly prices a year ahead or even a week ahead is unrealistic. Fortunately, only the estimates of annual revenues and EES degradations need be relied upon, which are only weakly dependent on the variance of the hourly price forecasting error as was observed in simulations of the system, though the mean of forecasting error does matter. The projected life-cycle benefit and corresponding MBU will inevitably change as the expectations on the future electricity market prices change, much like the fluctuations of stock market values.

The optimality proof of the framework in terms of life-cycle profit and detailed formulations are presented below.

The objective of EES operation is to maximize the present value of EES life-cycle benefit, which is the sum of the present value of all short-/mid-term benefits over the EES lifetime, subject to degradation constraints, as expressed by equations (1)-(3):

$$LB_{max} = \max_{d_t} LB = \sum_t \delta_t SB_t(d_t, \lambda_t) \quad (1)$$

$$\text{s.t.} \sum_t d_t = D \quad (2)$$

$$d_t \geq C \quad (3)$$

where:

LB represents the life-cycle benefit of EES;

$SB_t$ is the maximum short-term benefit at time t as a function of the EES degradation and market prices (or other benefit rates) at time t, denoted by $d_t$ and $\lambda_t$, respectively;

D is the degradation (energy throughput) limit over the EES lifetime or the remaining energy throughput for an old EES; and C is the calendar degradation rate. The calendar degradation rate C in equation (3) and the lifetime degradation limit in D equation (2) may first provided by manufacturer and then dynamically updated through learning techniques based on recent data from the BMS, including energy capacity, charging/discharging profile, state of charge, state of health, etc.

Given price projections $\lambda_t$, the decision variable of the long-term optimization model of equations (1)-(3) is $d_t$, the EES degradation at each time t. Equation (2) describes the constraint that the total energy throughput over the EES life has a limit, determined by the adopted end-of-life criterion. Equation (3) models the calendar degradation of the EES (which occurs even when the EES remains idle).

The Lagrangian function of the long-term optimization model of equations (1)-(3) is:

$$L = \sum_t \delta_t SB_t(d_t, \lambda_t) + \mu\left(D - \sum_t d_t\right) + \sum_t \alpha_t(C - d_t) \quad (4)$$

where $\mu$ and $\alpha_t$ are Lagrangian multipliers.

If $SB_t(d_t, \lambda_t)$ is differentiable and concave over $d_t \geq C$, then the first-order Karush-Kuhn-Tucker (KKT) conditions are given by equations (2), (3) and (5)-(7):

$$\frac{\partial L}{\partial d_t} = \delta_t \frac{\partial SB_t(d_t, \lambda_t)}{\partial d_t} - \mu - \alpha_t = 0 \quad (5)$$

$$\Rightarrow \frac{\partial SB_t(d_t, \lambda_t)}{\partial d_t} = \frac{\mu + \alpha_t}{\delta_t}$$

$$\alpha_t(C - d_t) = 0 \quad (6)$$

$$\alpha_t > 0 \quad (7)$$

From (5) and (6), it can be observed that if $d_t > C$, which indicates the EES is operating at time t, then:

$$\frac{\partial SB_t(d_t, \lambda_t)}{\partial d_t} = \frac{\mu}{\delta_t} \quad (8)$$

$\mu$ can be designated as the life-cycle MBU, and $$\frac{\mu}{\delta_t}$$

as the discounted MBU. The mathematical formulations of the decision procedures in the embodiments herein, which can be adopted as a whole or in parts in related decision software for EES operation or control, are as follows:

Short-Term Decision.

The charge/discharge schedules of EES, given a discounted MBU, can be determined by solving the optimization model of equation (9):

$$SB_t(\mu, \lambda_t) = \max_{P_t \in F} r_t(P_t, \lambda_t) \quad (9)$$

$$\text{s.t.} \quad \frac{\partial r_t(P_t, \lambda_t)}{\partial d_t(P_t)} = \frac{\mu}{\delta_t}$$

$$d_t(P_t) > C$$

where $r_t(P_t, \lambda_t)$ is the short-term benefit (can include some negative terms such as fixed O&M cost, tax expense, etc.) at time t as a function of the charge/discharge schedules at time t, denoted by $P_t$ as well as market prices; and F is the feasible operating set of the EES, typically convex. The feasible operating set F requires the information of the power and energy capacities of the EES, which can be read directly from the BMS, and the efficiency can be calculated based on a series of recent charging/discharging profiles, also collected from the BMS.

It should be noted that the short-term benefit $r_t(P_t, \lambda_t)$ may take different forms in different embodiments. The EES degradation at time t, $d_t$, can also be expressed as a function of the charge/discharge schedules $P_t$. If there exists no feasible solution to equation (9), the short-term decision and the corresponding degradation and revenue are given by:

$$\begin{cases} P_t = 0 \\ d_t = C \\ SB_t = 0 \end{cases} \quad (10)$$

Mid-Term Update.

Calculate discounted MBU $$\frac{\mu}{\delta_t},$$

given a life-cycle MBU.

Long-Term Decision.

Determine the value of life-cycle MBU $\mu$, based on price projections by solving the optimization model of equation (11):

$$\max_\mu LB = \sum_t \delta_t SB_t(\mu, \lambda_t) \quad (11)$$

$$\text{s.t.} \quad \sum_t d_t(\mu) = D$$

$$d_t(\mu) \geq C$$

The KKT conditions indicate that as long as $$r_t(P_t, \lambda_t) - \frac{\mu}{\delta_t} d_t(P_t)$$

is concave (subgradient method can be applied if not-differentiable), the maximum life-cycle benefit can be achieved by following the above decision procedures. $r_t(P_t, \lambda_t)$ is usually concave, if not linear, while $d_t(P_t)$ is convex when the total cycle number of the EES, $N_{DOD}$, is a convex function of the depth-of-discharge (DOD) of the EES:

$$N_{DOD} = g(DOD) \quad (12)$$

Function g is a degradation function of the EES, as shown by equation (13):

$$N_{DOD} = N_0 DOD^k \quad (13)$$

where No is the total cycle number at 100% DOD; and k is a parameter related to EES chemistry. Therefore, k<−1 is a sufficient optimality condition in terms of EES life-cycle benefit. The power function g in Equations (12) and (13) can be first provided by manufacturer and then dynamically updated through learning techniques based on recent data from the BMS, including energy capacity, charging/discharging profile, state of charge, state of health, etc.

The ABU and the ACD are calculated as shown in equation (14). When the ABU is larger than the ACD, then:

$$ABU = \frac{LB_{max}}{D}, ACD = \frac{CAPEX}{D} \quad (14)$$

Figure 2:
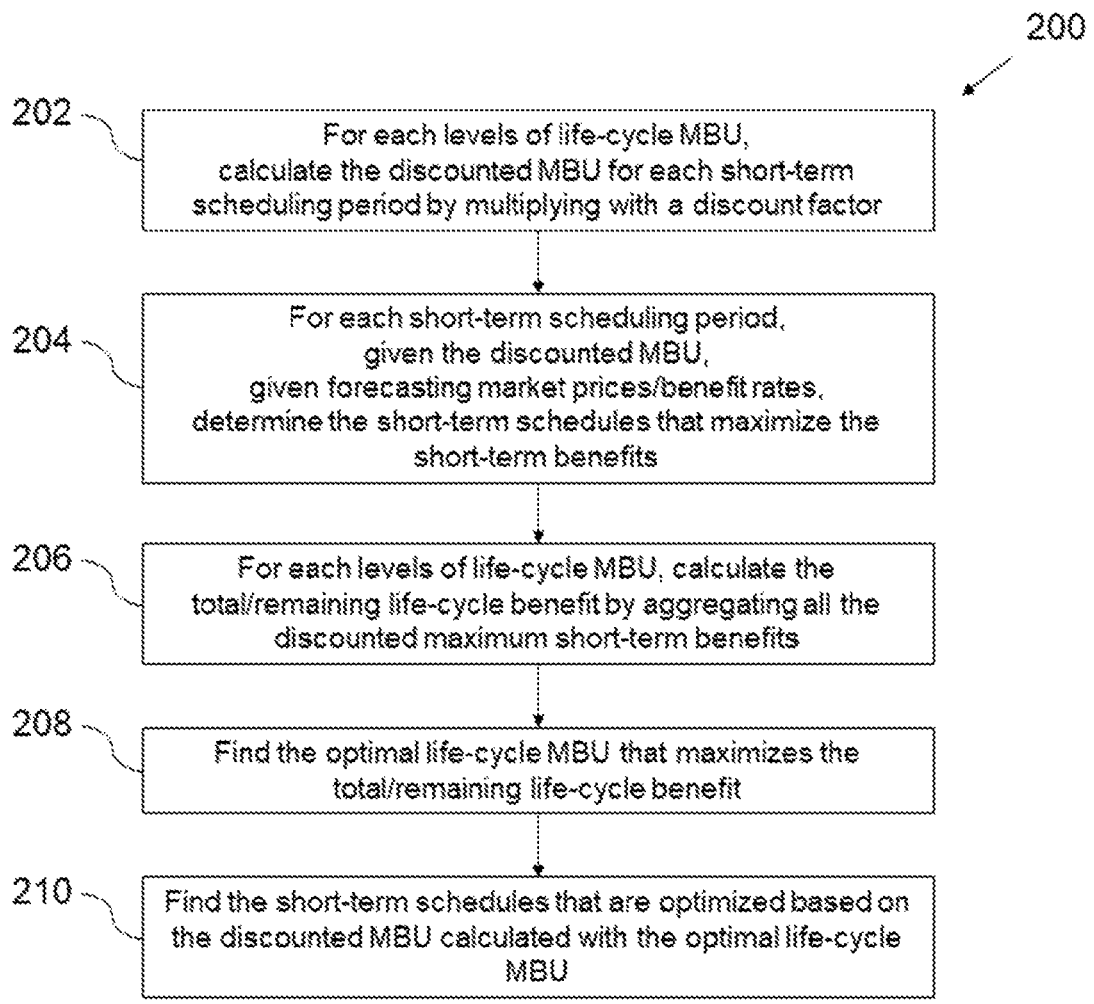
FIG. 2 is a flow chart that describes the procedures to implement the intertemporal decision methods for EES operation from short to long terms.

An example to solve the entire optimization problem of equations (9)-(11) is described in FIG. 2. The solving algorithm 200, which may also be adopted in whole or in parts in related decision software, starts with step 202 that enumerates all discrete quantized values of life-cycle MBU and calculates corresponding discounted MBUs for each mid-term scheduling periods. The next step 204 solves equation (9) to determine the optimal short-term EES outputs/usages that maximize the short-term benefits for each value of discounted MBUs and each short-term scheduling periods. At step 206, for each values of life-cycle MBU, adding all discounted maximum short-term benefits, which are the products of a discount factor and the maximum short-term benefit as equation (11), to calculate the total/remaining life-cycle benefits. The total/remaining life-cycle benefits that correspond to each discrete quantized values of life-cycle MBU are then known. Step 208 determines the optimal value of life-cycle MBU that maximizes the total/remaining life-cycle benefit. The maximum total/remaining life-cycle benefit, as the remaining economic value of the EES, can, in some embodiments, be applied in related EES valuation software. Given the optimal life-cycle MBU and corresponding discounted MBUs, the optimal schedules/usages of EES for each period based on the results in step 204 is determined in step 210. The schedules are the charging/discharging power magnitudes of EES for each time period in a short-term period, which include when to start and stop and how much to charge/discharge.

Figure 3:
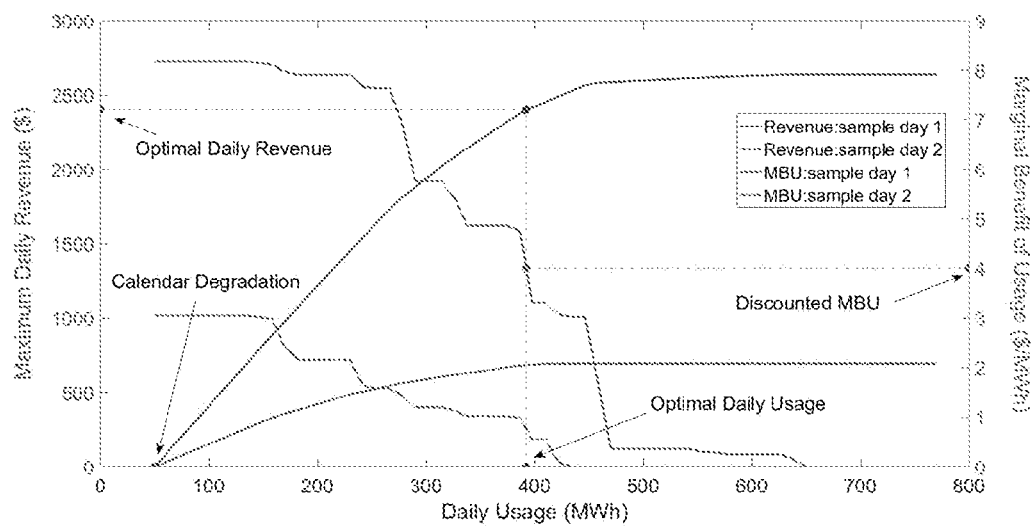
FIG. 3 is an illustration of how daily usages and maximum revenues of EES are determined given prices and discounted MBU for two sample days.

FIG. 3 illustrates how to determine the daily usages of a 50 MW/200 MWh lithium-ion EES and the maximum daily revenues in short-term given market price forecasts and a discounted MBU for two sample days, as in step 204 of FIG. 2. With market prices forecasts in the two sample days, the maximum daily revenue with EES degradation/usage (charging and discharging energy throughput) no more than U can be calculated by solving the model given by equation (15) for different values of usage limitation U, as the two increasing curves in FIG. 3.

Figure 4:
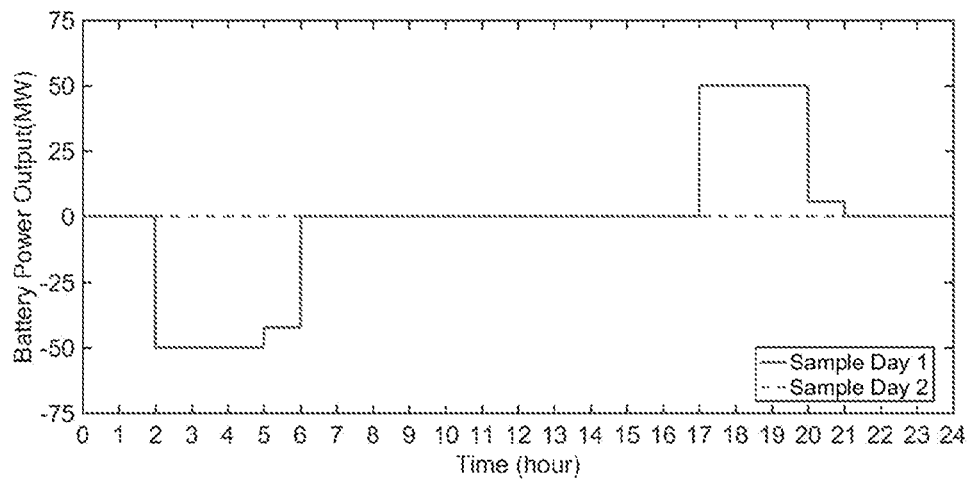
FIG. 4 is a graph depicting the power output profiles of EES for two sample days.

The slopes of the maximum daily revenue curves are exactly the MBUs, defined as the increase in the maximum daily revenue if allowing for one unit of additional EES usage, as the two decreasing curves in FIG. 3. As an illustrative example, assume that if the discounted MBU for this day is $4/MWh, then the daily usage in sample day 1 is slightly less than 400 MWh, which is equivalent to one full cycle, and the maximum daily revenue is around $2400, as the intersection points in FIG. 3. For sample day 2, however, the MBU can never reach $4/MWh, which implies that the benefit potential in this day is comparatively low, so the EES stops operation in this day, earning no revenue, and the daily usage/degradation is equal to the calendar degradation. FIG. 4 depicts the charge/discharge schedules of the EES for the two sample days with a discounted MBU of $4/MWh. In sample day 1, the EES conducts one cycle, while in sample day 2, the EES stays idle.

$$SB_t(\mu, \lambda_t) = \max_{P_t \in F} r_t(P_t, \lambda_t) \quad (15)$$

$$\text{s.t.} \quad d_t(P_t) \leq U$$

Figure 5:
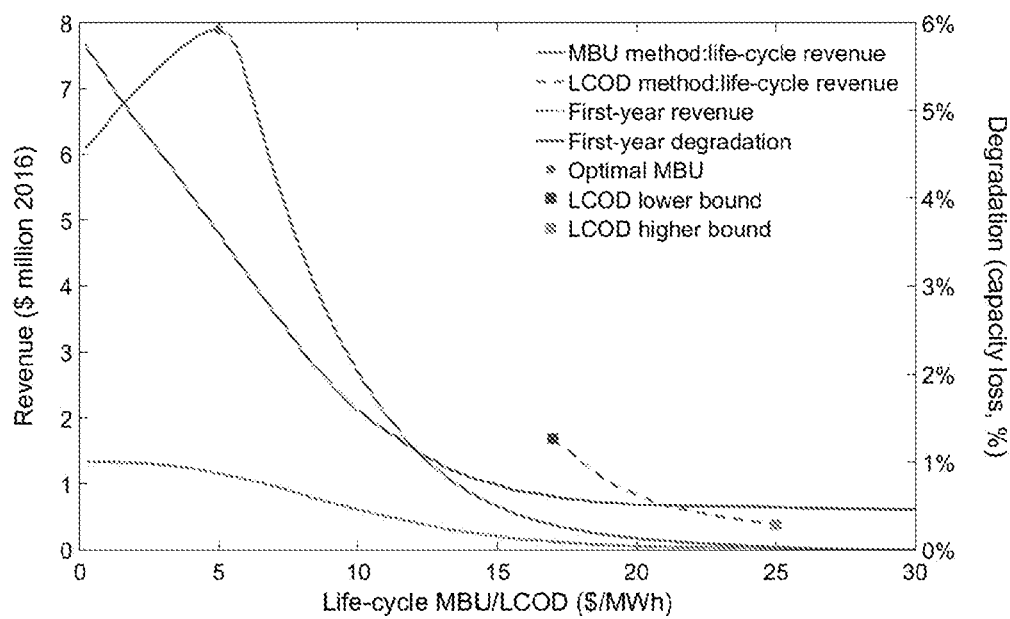
FIG. 5 is an illustration of how the optimal life-cycle marginal benefit of usage is determined in long term to maximize the life-cycle efficiency of EES and how the LCOD method deviates from the optimal solution.

FIG. 5 illustrates how to determine the optimal life-cycle MBU in long-term scenarios to maximize the life-cycle benefit of EES in an energy arbitrage/solar integration application, as shown in step 208 of FIG. 2, and how the LCOD method deviates from the optimal solution. The operation of a 50 MW/200 MWh high-power-density lithium-ion EES system in California was simulated. The following assumptions were made: (1) the charge/discharge efficiency is 90%, which leads to an 81% round-trip efficiency, and (2) the EES system can take 3000 full cycles over its life before the remaining capacity decreases to 70% of the initial. The energy throughput (charging plus discharging) in MWh is used as the measure of EES utilization and degradation. Generally, the more energy throughput the EES has processed, the more degradation the EES experiences. For this EES system, 3000 full cycles are equivalent to a throughput of 1.2 TWh if the system does not degrade, however it is worth noting that if the capacity loss of the EES is considered, more than 3000 full cycles will be needed to process 1.2 TWh, because the processed energy of each full cycle decreases as the available capacity decreases.

Moreover, assuming the life of the EES ends when the capacity has decreased to 70% of the initial, 1.2 TWh processed energy corresponds to 30% capacity loss. The calendar degradation of the EES, which represents the degradation independent of the number of cycles, is assumed to be equivalent to processing at 50 MWh/day (about 0.5% capacity loss/year). The day-ahead energy market prices from CAISO in 2016 were used to optimize EES operating strategies and calculate market revenues. For simplicity, it is assumed that the prices are the same in the following years, and the EES operator is a price-taker and has perfect price information. A discount rate of 7% was applied. Additionally, tax expense, salvage value and other fixed O&M costs was not accounted for in the results, but they are easy to include in other embodiments.

The life-cycle revenue of the EES reaches the maximum, $7.9 million, at a MBU of $5/MWh, as shown in FIG. 5.

This implies that the short-term marginal revenue per unit degradation/energy throughput should be set, in the first year, at $5/MWh and adjusted by a discounting factor in the following years to achieve the maximum life-cycle revenue. As the MBU increases, the EES is utilized less every year, so the total revenue in a single year decreases, and the annual degradation also decreases, which indicates that the EES life increases. In this sense, varying MBU reflects a trade-off between short-term profits and the EES lifetime. In some circumstances, for example, when the price difference between the peak and valley prices is small, the EES should save its life and wait for better profit opportunities, while in other cases, its capacity should be fully utilized to capture the opportunity. The criterion to identify profit opportunity is the long-term optimized and discounted MBU.

Given that the unit capacity capital cost of the lithium-ion EES with high energy density ranges from $200 to $300/kWh, and assuming the degradations are uniformly allocated in 15 years and the ratio of total depreciation to capital cost is 30% which equals to the capacity loss when the EES life ends, the LCOD range of the EES is $17 to $25/MWh. If this value range is used as the marginal cost per unit degradation to make EES operational decisions, the life-cycle revenue of the EES will be no more than $1.7 million, only 22% of the maximum, as in FIG. 5. The huge revenue loss is expected as the LCOD method does not intend to maximize the life-cycle revenue of the EES. Instead, it requires the EES to operate only when the potential marginal benefit is high enough to compensate for the average unit depreciation cost, and to wait otherwise, ignoring the fact that the EES has a calendar life. As such, the time period to wait for an opportunity to operate the EES is limited. Even if the marginal benefit is lower than the average unit depreciation cost, it may sometimes be better to operate the EES, rather than getting no return.

Figure 6:
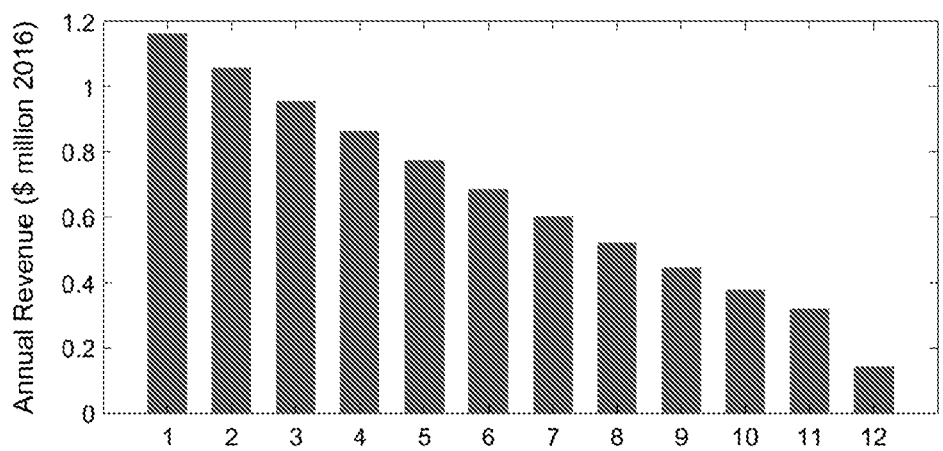
FIG. 6 is a bar chart that presents the annual revenues of a sample lithium-ion EES.
Figure 7:
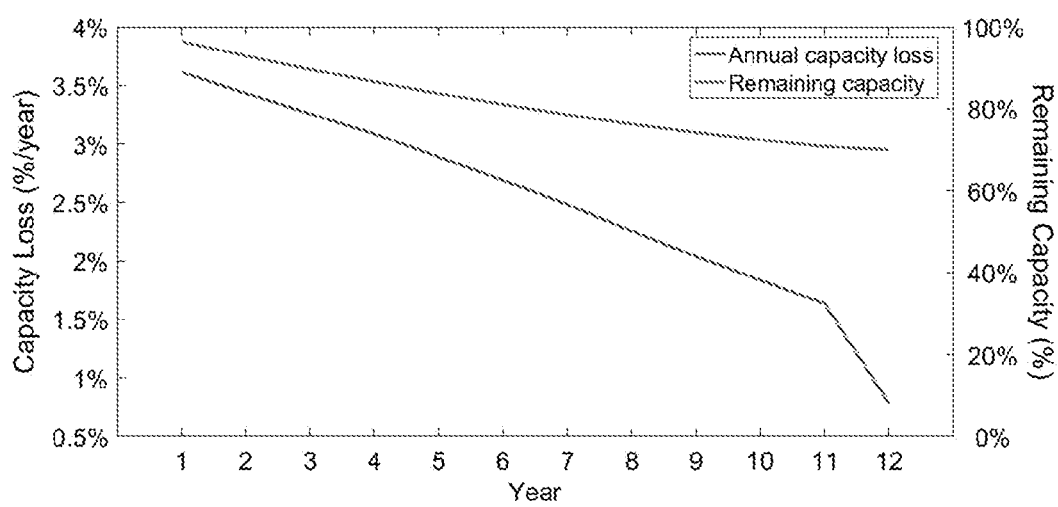
FIG. 7 is a graph that depicts the annual capacity loss and remaining capacity of a sample lithium-ion EES assuming the prices are expected to be the same among different years.

When the MBU is higher, there is less qualified profit opportunity for an EES in a year, so the EES operates less frequently. Because the short-term scheduling applies a discounted MBU (DMBU), which increases every year, the annual degradation and revenues decrease from year 1 to year 12 (the end of life), as shown in FIGS. 6 and 7. The time preference of the EES operator, which is to utilize the EES and earn revenues sooner than later, which is ignored by the LCOD method, is translated in this outcome of decreasing annual EES utilization and revenues. An EES may be considered to have reached its end-of-life when it's current energy capacity decreases to a certain percentage of the initial energy capacity.

Figure 8A:
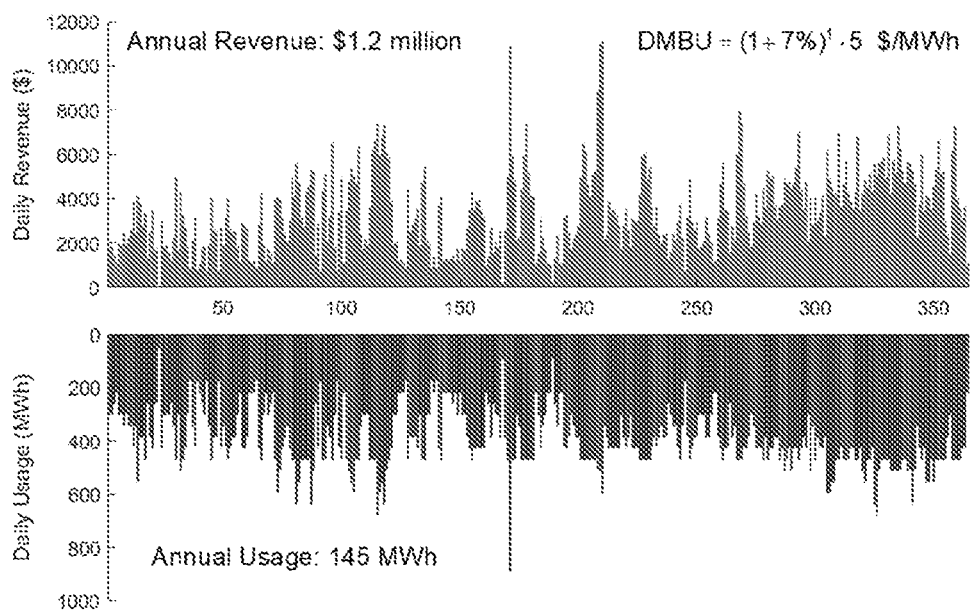
FIGS. 8A and 8B are bar charts that present the daily maximum revenues and usages in Year 1 and Year 11, respectively, for a sample lithium-ion EES in energy arbitrage/solar integration application assuming the prices are expected to be the same among different years.
Figure 8B:
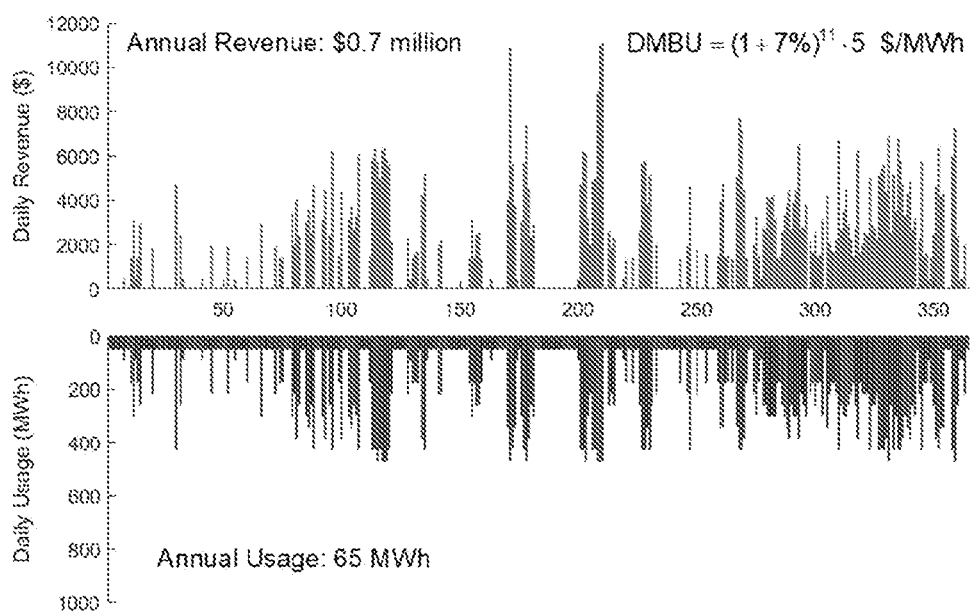

FIGS. 8A-B illustrate the time preference by comparing the optimal short-term (daily) schedules between Year 1 and Year 11. Although the daily prices are assumed to be the same for the two years, Year 1 earns almost twice revenues and processes more than twice energy compared to Year 11, as its DMBU is much lower. The implication is that the EES should be used more frequently (more days in operating status) and intensively (deeper cycle), and vice versa.

The ABU in this case is approximately $7/MWh, much lower than the lower bound ACD of $33/MWh ($200/kWh capital cost) and even an ACD of $21/MWh assuming a target cost of $125/kWh set by the EES R&D program of U.S. Department of Energy. This indicates that if there is no subsidy and the peak-valley price difference does not increase, EESs would not be economically feasible for arbitraging in California. The break-even capital cost of the EES is approximately $40/kWh, and the minimum required subsidy to make EES economically viable in this case is $26/MWh, the difference between ACD and ABU.

Figure 9:
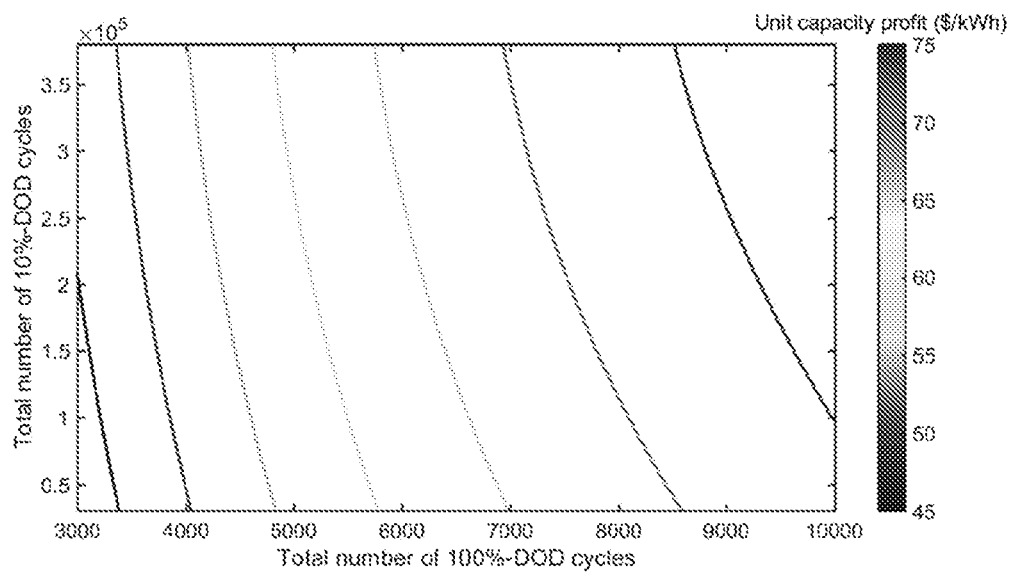
FIG. 9 is a graph that presents the unit capacity profits of EESs with different cycling capabilities.
Figure 10:
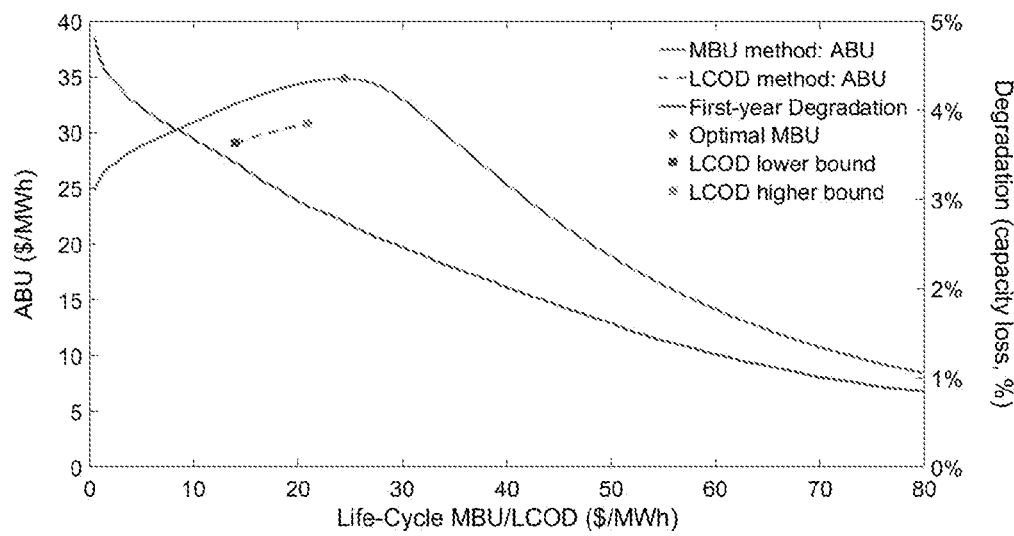
FIG. 10 is an illustration of how the optimal life-cycle marginal benefit of usage is determined in long term to maximize the ABU of EES and how the LCOD method deviates from the optimal solution.

An EES with longer cycle life, to which enormous development efforts have been devoted, will inarguably earn more revenues over its life. However, there is a trade-off between the cycle life and the capital cost for any EES chemistries and applications. FIG. 9 is an example of how the invented systems and methods can be applied to analyze this trade-off and indicate the R&D path for EES. The unit capacity profits for an EES with different deep and shallow cycling capabilities are calculated using the invented methods and presented in FIG. 9. An EES characterized by 10,000 cycles at 100% DOD and 100,000 cycles at 10% DOD can gain a profit of $75/kWh in the CAISO 2016 price scenario, compared to less than $45/kWh with 30% capabilities for both deep and shallow cycling. The marginal contribution of cycling capability to EES profitability is decreasing, which implies that if a unit improvement in cycling capability takes a constant capital cost per unit capacity, there exists an optimal configuration when the unit improvement cost and the corresponding extra revenue are equal. Moreover, since the deep and shallow cycling capabilities of EES have different marginal rates of contribution to the profitability, they should be configured separately, if technically feasible, according to their unit improvement costs.

The invented decision methods and software can also be applied to other applications, e.g., those with multiple revenue streams. A combining application of energy arbitrage and frequency regulation is examined here for the 50 MW-200 MWh lithium-ion EES with the same parameters as before. In addition to energy market prices, regulation capacity and mileage prices are used as well as real-time regulation mileages from CAISO in 2016 to optimize EES operating strategies and calculate market revenues.

The optimal MBU is $25/MWh for this combined application, as shown in FIG. 5. This optimal MBU is much higher than the one in the single application of energy arbitrage, because the profit opportunity in frequency regulation market is much greater, though the market size is comparatively small, and it should be expected that every unit of degradation to make more profit through setting a higher MBU. The ABU is also higher in this case, indicating no subsidy is required for the EES to be economically viable. The outcomes of LCOD method are also dominated by that of MBU method, with a 12% revenue loss at minimum.

The decision and valuation methods described herein may be conveniently implemented with one or many machines, centralized computer or distributed controller. The software coding can be easily completed by skilled programmers according to the description and formulations in the present disclosure. The software may be applied to manage a single or multiple, stationary or distributed, commercial or residential EES systems. Such software may also be combined with any market forecasting methods that provide necessary inputs for the invented methods, as well as EES state monitoring systems.

It should be noted that besides a number of embodiments of the invention illustrated foregoing, various modifications and additions can be made without deviating from the principle and scope of this invention. Minor steps, features or variables can be added to, removed from, or reordered in the invented methods and algorithm. Although particular EES chemistries, applications and parameters are used to illustrate the invention, the description and figures herein should only be taken by examples, not to limit the scope of this invention otherwise.

In various embodiments, the invention may be implemented with combinations of multiple components or modules. As used herein the terms "component" and "module" are intended to refer to computer-related entities, comprising either hardware, a combination of hardware and software, software, or software in execution. For example, a component and/or module can be implemented as a process running on a processor, a hard disk drive, multiple storage drives (of optical and/or magnetic storage medium), an object, an executable, a thread of execution, a program, and/or a computer. By way of illustration, both an application running on a computer and the computer can be a component and/or module. One or more components and/or modules can reside within a process and/or thread of execution, and a component and/or module can be localized on one computer and/or distributed between two or more computers as desired for a given implementation. The embodiments are not meant to be limited in this context. Components or modules may be implemented along functional lines, but the invention is not meant to be limited to any specific arrangement or architecture having functions defined using specific components or modules. A component or module may include a memory component comprising a transitory or non-transitory memory, or a combination of both, and a processor component, which may comprise one more of the memory component and processor components described herein. In some embodiments, software may be stored on a memory component and operative on a processor component to perform the functions of the described embodiments.

We claim:

1. A method of intertemporal electrochemical energy storage (EES) management comprising:
   calculating a discounted marginal benefit of use (MBU) as a function of a life-cycle MBU;
   determining an optimal short-term scheduling strategy and timing and price for bidding based on the discounted MBU and forecasted short-term market prices to maximize short-term benefits;
   wherein the MBU is a metric expressed in $/MWh calculated over the life-cycle of the EES; and
   wherein the discounted MBU is the MBU adjusted by a discount factor to reflect the time value of money.

2. The method of claim 1 further comprising:
   simulating short-term operation for all values of the MBU in a set of values based on future plice projections;
   computing a life-cycle benefit by aggregating maximum simulated short-term benefits for each time period of a plurality of time periods.

3. The method of claim 2 further wherein the discounted MBU is calculated for a plurality of mid-term time periods as the product of the life-cycle MBU and a discounting factor specific to each mid-term time period.

4. The method of claim 3 wherein the life-cycle MBU is calculated to maximize the life-cycle benefit;
   wherein the life-cycle benefit is the aggregate of the short-term benefits.

5. The method of claim 4 wherein the life cycle benefit is a function of a degradation limit and a calendar degradation rate, further comprising:
   interfacing with a battery management system connected to the EES to receive data including at least an energy capacity, charging/discharging profile, state of charge and state of health of the EES; and
   calculating the degradation limit and a calendar degradation rate based on the collected data.

6. The method of claim 1 wherein the scheduling strategy comprises times to start and stop charge or discharge and how much to charge or discharge.

7. The method of claim 6 further comprising controlling the charge and discharge of the EES by interfacing with a battery management system connected to the EES.

8. The method of claim 1 wherein the scheduling strategy is a function of power and energy capacities of the EES, further comprising:
   interfacing with a battery management system connected to the EES to receive data regarding the power and energy capacities of the EES.

9. The method of claim 8 wherein the scheduling strategy is a function of efficiency of the EES, further comprising:
   interfacing with a battery management system connected to the EES to receive data regarding a series of recent charging/discharging profiles of the EES; and
   calculating the efficiency based on the charging/discharging profiles.

10. The method of claim 1 further comprising automatically placing bids at the determined time and price.

11. The method of claim 1 wherein the short-term benefit for each period includes a term of electricity market revenue, wherein the electricity market revenue is a function of market prices and power outputs.

12. The method according of claim 1 wherein the short-term benefit for each period includes a fixed term which is the sum of all fixed costs.

13. The method of claim 1, wherein the short-term benefit of each period includes emission cost saving.

14. The method of claim 1, wherein the EES reaches end-of-life when current energy capacity decreases to a certain percentage of the initial energy capacity.

15. The method of claim 1, wherein short-term scheduling strategy and timing and price for bidding are rolling in time for online/dynamic control that takes advantage of the updated EES states and forecasting information.

16. A system for the intertemporal management of an electrochemical energy storage (EES) comprising:
   a processor;
   an interface between the processor and a battery management system connected to the EES;
   software, executing on the processor, the software performing the functions of:
      communicating with the battery management system via the interface to receive data regarding the power and energy capacities of the EES;
      calculating a discounted marginal benefit of use (MBU) as a function of a life-cycle MBU; and
      determining an optimal short-term scheduling strategy and timing and price for bidding based on the discounted MBU and forecasted short-term market prices to maximize short-term benefits;
      wherein the short-term scheduling strategy is a function power and energy capacities of the EES received from the battery management system;
      wherein the MBU is a metric expressed in $/MWh calculated over the life-cycle of the EES; and
      wherein the discounted MBU is the MBU adjusted by a discount factor to reflect the time value of money.

17. The system of claim 16 wherein the scheduling strategy is further based on the efficiency of the EES, further comprising:
   communicating with the battery management system via the interface to receive data regarding a series of recent charging/discharging profiles of the EES; and
   calculating the efficiency based on the charging/discharging profiles.

18. The system of claim 16 wherein the discounted MBU is calculated for a plurality of mid-term time periods as the product of the life-cycle MBU and a discounting factor specific to each mid-term time period.

19. The system of claim 18 wherein the life-cycle MBU is calculated to maximize the life-cycle benefit;
wherein the life-cycle benefit is the aggregate of the short-term benefits.

20. The system of claim 19 wherein the life cycle benefit is a function of a degradation limit and a calendar degradation rate, further comprising:
communicating with the battery management system via the interface to receive data including at least an energy capacity, charging/discharging profile, state of charge and state of health of the EES; and
calculating the degradation limit and a calendar degradation rate based on the collected data.

* * * * *

UNITED STATES PATENT AND TRADEMARK OFFICE
CERTIFICATE OF CORRECTION

PATENT NO. : 11,221,366 B2
APPLICATION NO. : 16/638409
DATED : January 11, 2022
INVENTOR(S) : Jay Whitacre et al.

Page 1 of 1

It is certified that error appears in the above-identified patent and that said Letters Patent is hereby corrected as shown below:

In the Claims

Column 13, Claim 2, Line 44; Please replace "based on future plice projections" with --based on future price projections--

Signed and Sealed this
First Day of March, 2022

Drew Hirshfeld
*Performing the Functions and Duties of the*
*Under Secretary of Commerce for Intellectual Property and*
*Director of the United States Patent and Trademark Office*